United States Patent [19]

Nägele et al.

[11] Patent Number: 5,453,638
[45] Date of Patent: Sep. 26, 1995

[54] BONDING AND ENCAPSULATED THREE DIMENSIONAL HYBRID INTEGRATED CIRCUIT MODULES

[75] Inventors: Dieter Nägele, Filderstadt; Manfred Weinacht, Dettingen/Teck; Klaus Färber, Kirchheim/Teck, all of Germany

[73] Assignee: Daimler-Benz Aerospace AG, München, Germany

[21] Appl. No.: 102,146

[22] Filed: Aug. 4, 1993

[30] Foreign Application Priority Data

Aug. 6, 1992 [DE] Germany .............. 42 26 064.7

[51] Int. Cl.⁶ .............. H01L 29/161; H01L 33/00; H01L 23/02
[52] U.S. Cl. .............. 257/414; 257/415; 257/431; 257/432; 257/433; 257/434
[58] Field of Search .............. 257/414, 415, 257/416, 417, 418, 419, 420, 431, 432, 433, 434

[56] References Cited

U.S. PATENT DOCUMENTS 4,585,300 4/1986 Landis et al. .............. 257/433

4,768,070 8/1988 Takizawa .

FOREIGN PATENT DOCUMENTS

| 1766499 | 4/1971 | European Pat. Off. . |
| 2233298 | 4/1973 | European Pat. Off. . |
| 3736292 | 5/1989 | Germany . |
| 4023792 | 1/1992 | Germany . |
| 4033999 | 4/1992 | Germany . |
| 3142957 | 10/1989 | Japan . |
| WO-A-89 03999 | 5/1989 | WIPO . |

Primary Examiner—Sara W. Crane
Assistant Examiner—Carl Whitehead, Jr.
Attorney, Agent, or Firm—McGlew and Tuttle

[57] ABSTRACT

System for packaging integrated circuits, especially sensors, in a housing, which also comprises multicontact bondings, especially hybrid ICs for three-dimensional arrangement of modules, wherein sensors (4, 5) are arranged at an angle in relation to one another on the base plate or the substrate (1). The sensors are contained in the single housing together with contact pins (pins) (2), and are connected in one plane by automatic bonding.

9 Claims, 1 Drawing Sheet

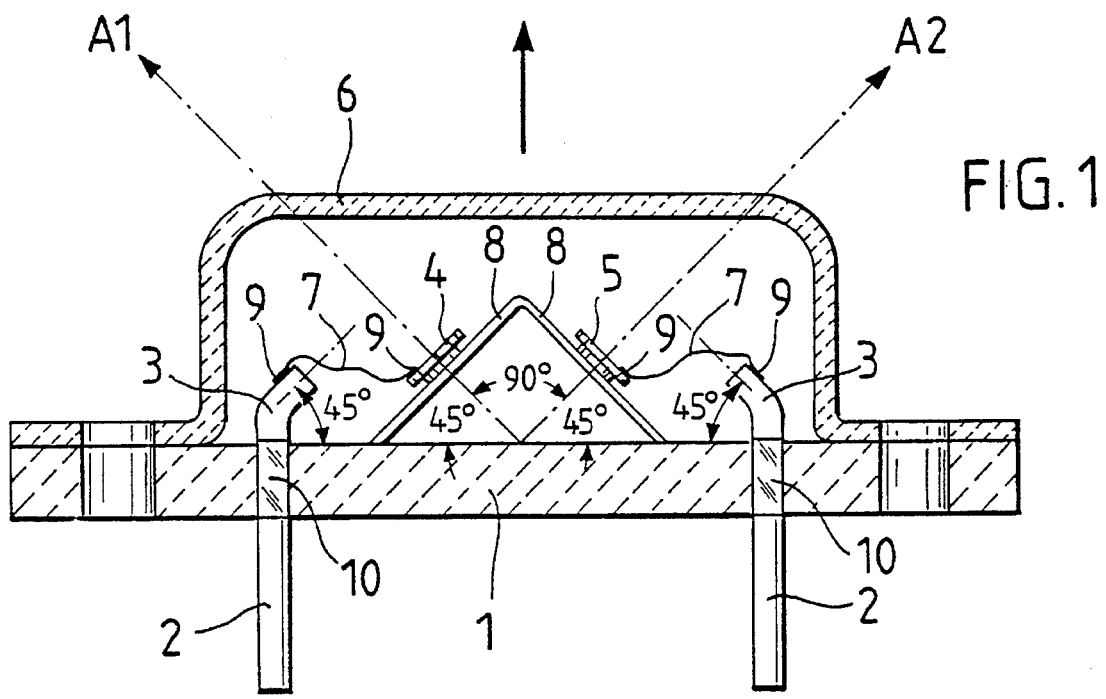
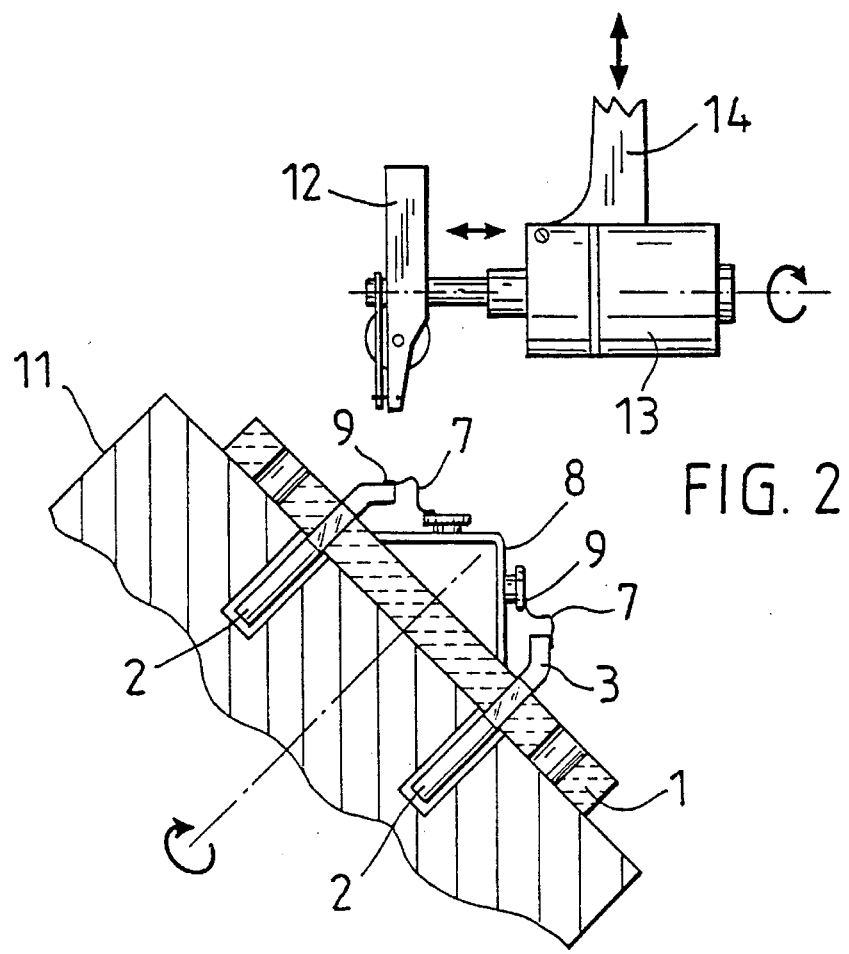

1

BONDING AND ENCAPSULATED THREE DIMENSIONAL HYBRID INTEGRATED CIRCUIT MODULES

FIELD OF THE INVENTION

The present invention relates to integrated circuit modules in general and more particularly to integrated circuits forming sensors such as acceleration sensors for vehicle restraint systems and the like wherein the principal axes of the integrated circuit sensor elements form an angle with each other in space, so-called three-dimensional hybrids, the invention also relates to the bonding and encapsulation of such three-dimensional hybrids.

BACKGROUND OF THE INVENTION

Sensors employing integrated circuit modules, particularly sensors with signal processing and evaluation circuits integrated on a chip have been used as acceleration sensors and the like in vehicle crash passenger restraint systems. Sensors positioned at different angles in the past have been provided as separate chips accommodated in separate housing (see for example German patent No. 37 36 24, particularly FIGS. 3 and 5). This structure is expensive to prepare in view of the multiple IC sensors and separate housings. Further, such circuits and their housings must also meet high requirements in terms of reliability because of the higher requirements imposed in safety systems for vehicles. The separate mounting of the integrated circuit sensors poses another serious problem with regard to fixing the sensors and their proper orientation.

SUMMARY AND OBJECTS OF THE INVENTION

The present invention is based on the above-mentioned patent (DE 37 36 294), and it is an object of the invention to increase the reliability of such measuring or sensor modules, on the one hand, and to provide such modules with a reduced manufacturing effort, on the other hand.

A further object of the invention is to provide a space saving, single housing structure with reliable bonding and packaging wherein the production of the sensor and housing structure can be automated for further cost savings.

A further object of the invention is to provide an arrangement of integrated circuits forming a sensor, signal processing and evaluation circuit wherein multiple integrated circuits are provided for different directional sensing, are mounted at an angle with respect to each other, are provided in a single housing wherein the integrated circuits are adapted to be electrically connected by bonding spots at connection wires wherein a bonding tool is used which acts in a single plane despite the fact that the IC chips are provided at an angle relative to one another.

According to the invention, a packaging arrangement or system for integrated circuits containing sensors on substrates, is provided wherein multicontact bondings for a three-dimensional arrangement of IC hybrid modules are accommodated in a single housing on a base plate. The IC containing sensors are disposed on each side of a carrier, at an angle in relationship to one another (on each side of the carrier which is angled). Contact pins are provided extending into the housing wherein each IC is connected to an associated pin via automatic bonding wherein a bonding tool is moved in a single plane (despite the fact that the IC's are situated at an angle with respect to each other).

According to the packaging system or packaging arrangement, the sensor modules are arranged on a metal angle or prism acting as a carrier. The IC hybrids have parallel bonding spots at their ends, which are introduced into the housing in a sealed manner, for the sensors and the contact pins. The bonding spots are arranged at an angle of 45° to the surface of the base plate. The pins preferably have glass coated ducts passing through the base plate.

According to a bonding method of the invention, a metal angle carrier is fixed to a base plate. The metal angle carrier preferably has a vertex defining a 90° angle with two legs wherein each leg is fixed or otherwise connected to the base plate. Each leg forms an approximately 45° angle with the base plate. IC hybrids or two integrated circuits each having an acceleration sensor or sensor and associated signal processing and evaluation circuit are disposed on each leg of the angle member. Each integrated circuit preferably includes a contact wire extending generally horizontally away from the IC and away from the angle bracket. A first pin and a second pin are inserted through the base plate. Preferably, each pin is bent to provide a bent end wherein said bent end is provided prior to inserting each pin into the base plate. Preferably, the end is bent at predetermined angle such as 45° whereby the bent end is directed toward an adjacent angle bracket leg to form a substantially parallel bonding surface (the surface is parallel to the IC on the angle bracket leg). The method further includes positioning the base plate with pins and angle bracket (with connected integrated circuit elements) on a rotatable and subsequently moving a tool, possibly linearly (only toward the pin and toward the end of the connection wire connected to the IC) or moving the tool only in a plane (toward the bonding spot on the pin and possibly also laterally (in a direction toward the pin or toward the IC). The tool is subsequently moved away from the bonding spot, the rotary table is rotated by 180° and the tool is again moved linearly (or in a plane) for bonding the connection wire (connected to the other IC) to the other pin.

The most essential advantages of the solution according to the present invention are that the sensors can be accommodated with their principal axes—here principal sensitivity axes ($A_1$, $A_2$)—in a desired direct the space of a vehicle as hybrid ICs in a housing, and all bondings can be performed at the same time with the packaging, especially by automatic bonding. These bondings are particularly facilitated in the present invention by the bond spots of the pins and the sensor modules being arranged in parallel to one another at the selected angle in the space or at 90° hereto, cf. drawing, which is enclosed for the description of an exemplary embodiment, without the present invention being limited thereto.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

BRIEF DESCRIPTION OF THE DRAWINGS

In the drawings:

FIG. 1 shows a cross section through the housing for the IC hybrids; and

FIG. 2 shows the work table for bonding, which is rotatable around its central axis inclined by 45°.

DETAILED DESCRIPTION OF THE PREFERRED EMBODIMENT

FIG. 1 shows the schematic design of the common housing for the IC hybrids 4, 5 in the built-in position facing toward the direction of travel according to the invention. The structure includes a base plate 1 traversed by pins 2. Preferably pins 2 with glass ducts 10 are employed, such as those which are commonly used in integrated circuitry and in hybrid technology and are easy to bond, especially by wire bonding. Before the pins 2 are inserted into the base plate 1, the pins are bent at their ends 3, which are the top ends in the drawing, by a predeterminable angle, e.g., 45°, and thus they form parallel bond surfaces to the sensors in the spatial direction 1 and to the sensors (4, 5) in the direction of the sensor axes A1 and A2. These bent ends 3 are oriented at an angle of 90° in relation to one another and 45° in relation to the substrate or the base plate in the preferred embodiment shown. The corresponding angles may also differ from those specified here if needed, depending on the particular application. The sensors 4, 5, which are arranged in parallel to the bent ends 3 of the pins 2, can be bonded automatically in one operation according to the present invention. Thin bonding wires 7 from the IC hybrids with the sensors 4, 5 on their IC carriers 8 are connected to the ends 3 of the pins 2 by automatic bonding on the bonding spots 9.

One very essential advantage of the present invention is that the base plate 1 is absolutely flat, at least on the side facing the housing 6. The housing, especially a rectangular housing, comprises not only the sensors 4 and 5 on their IC carriers 8 bent toward each other, but it also envelops the pins 2, here the ends 3 of the pins 2, which are bent or beveled or otherwise arranged at an angle to the base plate 1. The absolutely flat top side of the base plate 1 offers the advantage that absolutely sealed connection of the housing and base plate can be prepared easily and automatically. The IC carriers 8 may be simple plates, which are soldered, welded or similarly firmly connected to the base plate 1 at the selected angle.

Another advantage of the present invention is seen in FIG. 2, which represents automatic bonding by means of a robot.

The base plate 1 with the hybrids 4, 5 on their carriers 8 is clamped onto the rotary table 11. The table can also be tilted, if necessary, by 45°. The oblique position of the table 11 shown in FIG. 2 is the preferred working position for bonding. Only vertical movement of the bonding tool 12 is needed here to connect the wires 7 by pressure and heat to the bonding spots 9, which were applied beforehand in parallel to one another, as shown. The tool 12 needs to be moved only by a predetermined distance in the predetermined direction (to 14), even though the robot head 13 also permits pivoting and horizontal movement.

The present application can be applied in acceleration sensors, as mentioned in the German patent cited in the introduction.

While a specific embodiment of the invention has been shown and described in detail to illustrate the application of the principles of the invention, it will be understood that the invention may be embodied otherwise without departing from such principles.

What is claimed is:

1. An integrated circuit (IC) sensor module, comprising:
    a first IC sensor;
    a second IC sensor;
    a base plate;
    a carrier connected to said base plate, said carrier including a first leg portion supporting said first sensor and a second leg portion supporting said second sensor, said first leg portion being at an angle with respect to said second leg portion, said first sensor and said second sensor being positioned on said carrier with said first sensor at an angle in relation to said second sensor;
    a first contact pin provided adjacent to said carrier, said first contact pin having a bent end, said bent end of said first contact pin being disposed parallel to said first leg of said carrier providing a first pin surface which is parallel to a contact surface of said first IC sensor;
    a second contact pin provided adjacent to said carrier, said second contact pin having a bent end, said bent end of said second contact pin being disposed parallel to said second leg of said carrier providing a second pin surface which is parallel to a contact surface of said second IC sensor;
    a first wire connecting said first contact pin to said first sensor, said first contact wire being bonded to said first contact pin first pin surface;
    a second wire connecting said second contact pin to said second sensor, said second contact wire being bonded to said second contact pin second pin surface; and
    a single housing connected to said base plate, said first IC sensor, said second IC sensor and said carrier being disposed within said single housing.
2. A module according to claim 1, wherein
    said first wire is bonded to said first contact pin at a first pin bond spot and said first wire is connected to said first IC at a first IC bond spot to form a first wire connection, said second wire is bonded to said second contact pin at a second pin bond spot and said second wire is connected to said second IC at a second IC bond spot to form a second wire connection, said first pin bond spot, said second pin bond spot, said first IC bond spot and said second IC bond spot lying substantially in a plane, whereby each contact pin and associated sensor is provided by forming a bonding spot at each contact pin using a tool moving in a single plane.
3. A module according to claim 2, wherein
    said carrier has a central axis which is perpendicular to said base plate, said first pin bond spot and said second pin bond spot being spaced substantially an equal distance from said central axis, said first IC bond spot and said second IC bond spot being spaced substantially an equal distance from said central axis whereby said first wire contact is formed by moving said tool linearly to form a contact between said first wire, said first IC sensors and said first pin and said base plate is rotated 180° allowing said tool to move linearly to form a contact between said second wire, said wire second IC sensors and said second pin.
4. A module according to claim 1, wherein said IC sensors have wires with IC bonding spots at their ends, said IC bonding spots being parallel to a plane of each associated IC sensor, said IC sensor being sealed from the outside, within said housing.
5. A module according to claim 4, wherein:
    said IC bonding spots are arranged at an angle of 45° to the surface of said base plate.
6. A module according to claim 1, wherein:
    said pins have glass-coated ducts through said base plate.
7. A module according to claim 1, wherein
    said carrier is an angle bracket, said angle bracket having a vertex with said first and second leg portion wherein each leg portion is connected to said base plate;

said first IC sensor and said second IC sensor each have an associated signal processing and evaluation circuit, one sensor being disposed on each leg portion of said angle bracket, said first wire extending away from said first IC sensor and away from said angle bracket, said second wire extending away from said second IC sensor and away from said angle bracket;

said first pin and a said second pin being inserted through said base plate, each pin being bent to provide a bent end wherein said bent end is provided prior to inserting each pin into said base plate whereby the bent end is directed toward an adjacent angle bracket leg to form a substantially parallel bonding surface; and said bonding spots are formed by positioning the base plate with pins and angle bracket and connected integrated circuit sensors on a rotary table and subsequently moving a tool linearly toward one pin and an end of the connection wire connected to an adjacent IC to form a bonding spot bonding the wire to the pin and rotating the rotary table by 180° and moving the tool linearly and bonding the connection wire connected to the other IC to the other pin.

8. An integrated circuit (IC) sensor module, comprising:

a first IC acceleration sensor;

a second IC acceleration sensor;

a base plate;

a carrier connected to said base plate, said carrier including a first leg portion supporting said first sensor and a second leg portion supporting said second sensor, said first leg portion being at an angle with respect to said second leg portion, said first sensor and said second sensor being positioned on said carrier with said first sensor at an angle in relation to said second sensor;

a first contact pin provided adjacent to said carrier, said first contact pin having a bent end, a central axis of said bent end of said first contact pin being parallel to said first leg of said carrier with an outer first pin contact surface disposed parallel to a contact surface of said first IC acceleration sensor;

a second contact pin provided adjacent to said carrier, said second contact pin having a bent end, a central axis of said bent end of said second contact pin being parallel to said second leg of said carrier with an outer second pin contact surface of said first IC acceleration sensor which is parallel to said second leg of said carrier;

a first wire connecting said first contact pin to said first sensor, said first contact wire being bonded to said first contact pin;

a second wire connecting said second contact pin to said second sensor, said second contact wire being bonded to said second contact pin; and a single housing connected to said base plate, said first IC sensor, said second IC sensor and said carrier being disposed within said single housing.

9. An integrated circuit (IC) sensor module, comprising:

a first IC acceleration sensor;

a second IC acceleration sensor;

a base plate;

a carrier connected to said base plate, said carrier including a first leg portion supporting said first sensor and a second leg portion supporting said second sensor, said first leg portion being at an angle with respect to said second leg portion, said first sensor and said second sensor being positioned on said carrier with said first sensor at an angle in relation to said second sensor;

a first contact pin provided adjacent to said first sensor, said first contact pin having an exterior contact surface on a side of said first contact pin which is opposite said carrier, said first contact pin having a bent end, said bent end of said first contact pin being parallel to said first leg of said carrier, disposing said exterior contact surface parallel to said first leg;

a second contact pin provided adjacent to said first sensor, said second contact pin having an exterior contact surface on a side of said second contact pin which is opposite said carrier, said second contact pin having a bent end, said bent end of said second contact pin being parallel to said second leg of said carrier, disposing said exterior contact surface parallel to said second leg;

a first wire connecting said first contact pin to said first sensor, said first contact wire being bonded to said first contact pin;

a second wire connecting said second contact pin to said second sensor, said second contact wire being bonded to said second contact pin; and a single housing connected to said base plate, said first IC sensor, said second IC sensor and said carrier being disposed within said single housing.

\* \* \* \* \*